United States Patent
Chen et al.

(10) Patent No.: US 9,224,857 B2
(45) Date of Patent: Dec. 29, 2015

(54) SEMICONDUCTOR STRUCTURE AND METHOD FOR MANUFACTURING THE SAME

(71) Applicant: UNITED MICROELECTRONICS CORP., Hsinchu (TW)

(72) Inventors: Wei-Lin Chen, Changhua County (TW); Chih-Chien Chang, Hsinchu (TW); Ke-Feng Lin, Taipei (TW); Chiu-Te Lee, Hsinchu County (TW); Chih-Chung Wang, Hsinchu (TW); Chiu-Ling Lee, Hsinchu (TW)

(73) Assignee: UNITED MICROELECTRONICS CORP., Hsinchu ( * ) Notice: Subject to any disclaimer, the term of this patent is extended or adjusted under 35 U.S.C. 154(b) by 8 days.

(21) Appl. No.: 13/674,146

(22) Filed: Nov. 12, 2012

(65) Prior Publication Data

US 2014/0131797 A1    May 15, 2014

(51) Int. Cl.
| | | |
|---|---|---|
| H01L 29/78 | (2006.01) | |
| H01L 29/66 | (2006.01) | |
| H01L 29/06 | (2006.01) | |
| H01L 29/417 | (2006.01) | |
| H01L 29/08 | (2006.01) | |

(52) U.S. Cl.
CPC ........ *H01L 29/7816* (2013.01); *H01L 29/0653* (2013.01); *H01L 29/41766* (2013.01); *H01L 29/66681* (2013.01); *H01L 29/0878* (2013.01)

(58) Field of Classification Search
USPC .............. 257/342, 343, E21.54, E29.261; 438/296
See application file for complete search history.

(56) References Cited

U.S. PATENT DOCUMENTS

| | | |
|---|---|---|
| 4,344,081 A | 8/1982 | Pao et al. |
| 4,396,999 A | 8/1983 | Malaviya |
| 4,893,160 A | 1/1990 | Blanchard |
| 4,918,333 A | 4/1990 | Anderson |
| 4,958,089 A | 9/1990 | Fitzpatrick |
| 5,040,045 A | 8/1991 | McArthur |
| 5,268,589 A | 12/1993 | Dathe |
| 5,296,393 A | 3/1994 | Smayling |
| 5,326,711 A | 7/1994 | Malhi |
| 5,346,835 A | 9/1994 | Malhi |
| 5,430,316 A | 7/1995 | Contiero |
| 5,436,486 A | 7/1995 | Fujishima |

(Continued)

OTHER PUBLICATIONS

U.S. Appl. No. 13/454,149, filed Apr. 24, 2012.

(Continued)

*Primary Examiner* — Ori Nadav
*Assistant Examiner* — Vernon P Webb
(74) *Attorney, Agent, or Firm* — WPAT, PC; Justin King

(57) ABSTRACT

A semiconductor structure comprises a substrate having a first conductive type; a deep well having a second conductive type formed in the substrate and extending down from a surface of the substrate; a first well having the first conductive type and a second well having the second conductive type both formed in the deep well and extending down from the surface of the substrate, and the second well spaced apart from the first well; a gate electrode formed on the substrate and disposed between the first and second wells; an isolation extending down from the surface of the substrate and disposed between the gate electrode and the second well; a conductive plug penetrating into the isolation and reaching the bottom thereof; and a first doping electrode region having the second conductive type, formed within the second well and below the isolation to connect the conductive plug.

18 Claims, 2 Drawing Sheets

(56) References Cited

U.S. PATENT DOCUMENTS

| | | |
|---|---|---|
| 5,534,721 A | 7/1996 | Shibib |
| 5,811,850 A | 9/1998 | Smayling |
| 5,950,090 A | 9/1999 | Chen |
| 5,998,301 A | 12/1999 | Pham |
| 6,066,884 A | 5/2000 | Krutsick |
| 6,144,538 A | 11/2000 | Chao |
| 6,165,846 A | 12/2000 | Carns |
| 6,245,689 B1 | 6/2001 | Hao |
| 6,277,675 B1 | 8/2001 | Tung |
| 6,277,757 B1 | 8/2001 | Lin |
| 6,297,108 B1 | 10/2001 | Chu |
| 6,306,700 B1 | 10/2001 | Yang |
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama et al. |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,427,552 B2 | 9/2008 | Jin |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0261407 A1 | 11/2006 | Blanchard |
| 2006/0270134 A1 | 11/2006 | Lee |
| 2006/0270171 A1 | 11/2006 | Chen |
| 2007/0041227 A1 | 2/2007 | Hall |
| 2007/0082440 A1 | 4/2007 | Shiratake |
| 2007/0132033 A1 | 6/2007 | Wu |
| 2007/0273001 A1 | 11/2007 | Chen |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0108348 A1 | 4/2009 | Yang |
| 2009/0111252 A1 | 4/2009 | Huang |
| 2009/0159966 A1 | 6/2009 | Huang |
| 2009/0242981 A1* | 10/2009 | Fujita et al. ............... 257/335 |
| 2009/0243696 A1* | 10/2009 | Jeon et al. ............... 327/333 |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0096702 A1 | 4/2010 | Chen |
| 2010/0148250 A1 | 6/2010 | Lin |
| 2010/0213517 A1 | 8/2010 | Sonsky |
| 2011/0057263 A1 | 3/2011 | Tang |
| 2013/0075833 A1* | 3/2013 | Liu et al. ............... 257/411 |

OTHER PUBLICATIONS

U.S. Appl. No. 13/525,471, filed Jun. 18, 2012.

* cited by examiner

SEMICONDUCTOR STRUCTURE AND METHOD FOR MANUFACTURING THE SAME

BACKGROUND

1. Technical Field

The disclosure relates in general to a semiconductor structure and a method for manufacturing the same, and more particularly to a semiconductor structure having a conductive plug penetrating into the isolation as drain side, thereby decreasing the on-resistance (Ron).

2. Description of the Related Art

Reduction of feature size, improvements of the rate, the efficiency, the density and the cost per integrated circuit unit are the important goals in the semiconductor technology. With the development of semiconductor technology, high power devices have been applied to a variety of electronic products in different fields. Laterally diffused metal oxide semiconductor (LDMOS) or extended drain metal oxide semiconductor (EDMOS) is widely used in high voltage or high power PMIC (power management integrated circuit) application as the driving device.

On-resistance (Ron) is one of key factors of the semiconductor device. The lower the on-resistance or the specific on-resistance (Ron-sp), the lower the power consumption of the semiconductor device. Ron is a very important characteristic for the PMIC products, especially for the portable IC devices. Many improvements have been disclosed by modifying the structures of LDMOS or EDMOS devices; for example, changing the shape of shallow trench isolation (STI) or wells. However, Ron improvement is still limited on current LDMOS or EDMOS devices. No more than about 5% of improvement on the ratio of Ron to breakdown voltage (Ron/BVD) has been achieved by using well scheme or implant optimization.

SUMMARY

The disclosure is directed to a semiconductor structure and a method for manufacturing the same, which decreases the on-resistance of the semiconductor structure, thereby enhancing the characteristic of the device applied with the semiconductor structure.

According to the disclosure, a semiconductor structure is provided, comprising a substrate having a first conductive type; a deep well having a second conductive type formed in the substrate and extending down from a surface of the substrate; a first well having the first conductive type formed in the deep well and extending down from the surface of the substrate; and a second well having the second conductive type formed in the deep well and extending down from the surface of the substrate, and the second well spaced apart from the first well; a gate electrode formed on the substrate and disposed between the first and second wells; an isolation extending down from the surface of the substrate and disposed between the gate electrode and the second well; a conductive plug penetrating into the isolation and reaching a bottom of the isolation; and a first doping electrode region having the second conductive type, formed within the second well and below the isolation to connect the conductive plug.

According to the disclosure, a method of manufacturing semiconductor structure is provided, comprising: providing a substrate having a first conductive type; forming a deep well having a second conductive type in the substrate and extending down from a surface of the substrate; forming a first well having the first conductive type in the deep well and extending down from the surface of the substrate; forming a second well having the second conductive type in the deep well and extending down from the surface of the substrate, and the second well being spaced apart from the first well; forming an isolation extending down from the surface of the substrate and part of the isolation disposed in the second well; forming a gate electrode on the substrate and substantially disposed between the first and second wells; forming a contact hole penetrating into the isolation and reaching a bottom of the isolation; forming a first doping electrode region within the second well and below the contact hole, the first doping electrode region having the second conductive type; and forming a conductive plug in the contact hole to reach the bottom of the isolation, wherein the conductive plug connects the first doping electrode region.

DETAILED DESCRIPTION

Figure 1:
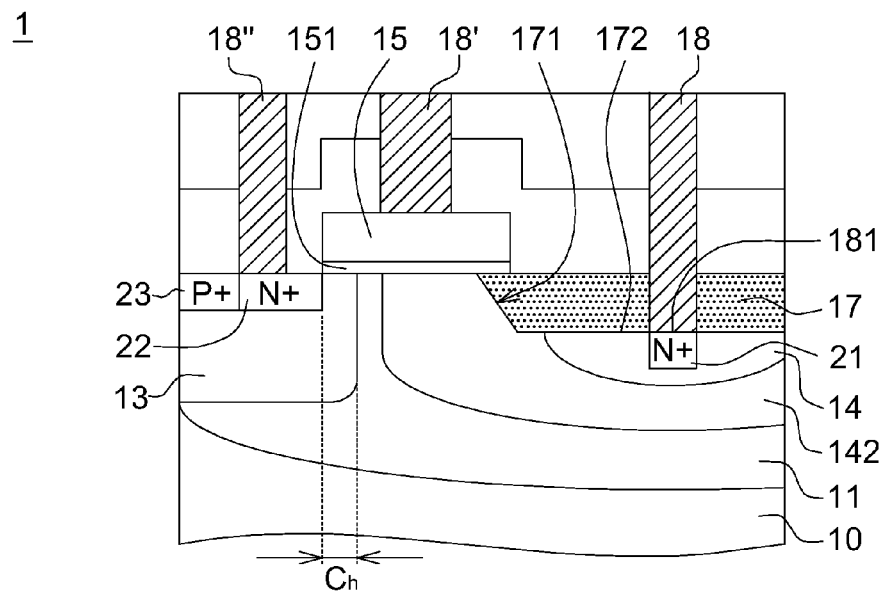
FIG. 1 is a partial drawing of a LDMOS device according to the embodiment of the disclosure.

In the present disclosure, a semiconductor structure and a method for manufacturing the same are provided. The semiconductor structure of the disclosure has a conductive plug penetrating into isolation as the drain side, thereby decreasing the on-resistance (Ron) and efficiently improving the electrical characteristics of the devices. The embodiments are described in details with reference to the accompanying drawings. The identical elements of the embodiments are designated with the same reference numerals. It is also important to point out that the illustrations may not necessarily be drawn to scale, and that there may be other embodiments of the present disclosure which are not specifically illustrated. Thus, the specification and the drawings are to be regard as an illustrative sense rather than a restrictive sense. Additionally, LDMOS devices are taken for illustration for describing the semiconductor structures of the embodiments. However, the disclosure is not limited to the LDMOS devices.

FIG. 1 is a partial drawing of a LDMOS device according to the embodiment of the disclosure. The LDMOS device 1 of the embodiment includes a substrate 10 having a first conductive type (such as P-type); a deep well 11 having a second conductive type (such as N-type) formed in the substrate 10 and extending down from a surface of the substrate 10; a first well 13 having the first conductive type (such as P-type) and a second well 14 having the second conductive type (such as N-type) spaced apart from each other and formed in the deep well 11 by extending down from the surface of the substrate 10; a gate electrode 15 (ex: polysilicon or metal gate with a gate oxide 151 beneath) formed on the substrate 10 and disposed between the first well 13 and the second well 14; an isolation 17, such as an oxide or STI, extending down from the surface of the substrate 10 and substantially disposed between the gate electrode 15 and the second well 14. In the embodiment, a first side wall 171 of the isolation 17 is disposed beneath the gate electrode 15 (i.e. the gate electrode 15 partially overlies the isolation 17), and part of the isolation 17 is disposed in the second well 14. The LDMOS device 1 further includes a conductive plug 18, a first doping electrode region 21 and a second doping electrode region 22. The first doping electrode region 21 having the second conductive type is formed within the second well 14 by extending down from the surface of the substrate 10 and below the isolation; for example, under the conductive plug 18 as shown in FIG. 1. The second doping electrode region 22 having the second conductive type is formed within the first well 13 and extending down from the surface of the substrate 10. The gate electrode 15 is disposed between the isolation 17 and the second doping electrode region 22. The first doping electrode region 21 and the second doping electrode region 22 function as a drain and a source of the device, respectively. In the embodiment, the conductive plug 18 penetrates into the isolation 17 and reaches a bottom 172 of the isolation 17. The first doping electrode region 21 is formed below the isolation 17 and connects the conductive plug 18, as shown in FIG. 1. In the embodiment, the bottom 181 of the conductive plug 18 is substantially aligned with the bottom 172 of the isolation 17.

In one embodiment, the first doping electrode region 21 contacts a bottom 181 of the conductive plug 18 as a drain region. In another embodiment, the LDMOS device 1 would optionally include a silicide (not shown in FIG. 1) formed at the bottom 181 of the conductive plug 18, so that the silicide is formed between the conductive plug 18 and the first doping electrode region 21. Additionally, the actual size of the conductive plug 18 could be adjusted according to the size of the device in practical applications, such as bottom width of the isolation 17, which is not limited herein.

Also, the LDMOS device 1 of the embodiment varies the doping concentrations of wells near the drain. As shown in FIG. 1, the LDMOS device 1 might further include a field region with the second conductive type such as a HVN field 142 around (ex: enclosing) the second well 14. The first doping electrode region 21 (drain), the second well 14, the HVN field 142, and the deep well 11 are respectively implanted in an order from heavy to light doping concentrations, which also improves the decrease of the on-resistance.

The LDMOS device 1 of the embodiment further includes a bulk region 23 formed within the first well 13 and adjacent to the second doping electrode region 22. The bulk region 23 has the first conductive type (such as P-type) and extends down from the surface of the substrate 10. Also, the LDMOS device 1 has the conductive plugs 18' and 18" respectively formed to connect the gate electrode 15 and the second doping electrode region 22, as the gate side and the source side. The conductive plugs 18, 18' and 18" could be a tungsten plug, or a plug made of other conductive materials. According to the embodiment, configuration of the conductive plug 18 connected to the first doping electrode region 21 could be achieved at the contact formation and conductive material filling processes (by photo and etching steps) simultaneously. Also, the contact hole for filling the conductive plug 18 as the drain side could be formed with the other contact holes for filling the conductive plugs 18' and 18". No extra mask and photolithography step are required to manufacture the semiconductor structure of the disclosure, which is simple and time-saving.

Moreover, the isolation 17 of the embodiment could be a single layer or a combination of multi-layers including several insulating layers. The combination of multi-layers of the isolation 17 could be selected from $SiO_2$, SiON, $Si_3N_4$, and materials with high dielectric constant. For example, the isolation 17 is a combination of the $SiO_2$ layer and the $Si_3N_4$ layer. Examples of materials with high dielectric constant include rare-earth (RE) oxides and lanthanide series metal oxides.

Figure 2:
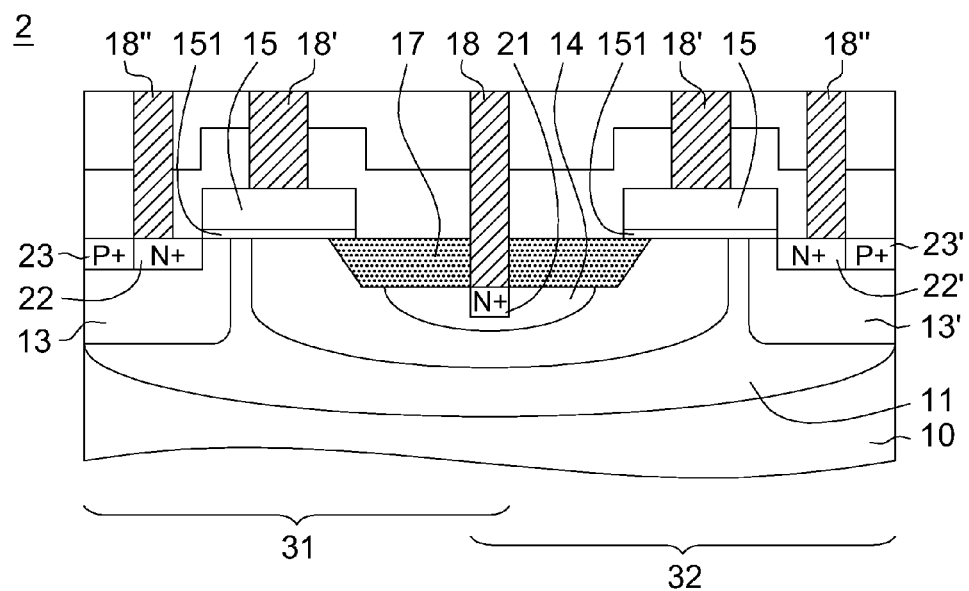
FIG. 2 is a partial drawing of a parallel-LDMOS device according to another embodiment of the disclosure.

FIG. 2 is a parallel-LDMOS device according to another embodiment of the disclosure. Structures of the LDMOS device 2 of FIG. 2 and the LDMOS device 1 of FIG. 1 are similar, except the LDMOS device 1 showing one MOS device and the LDMOS device 2 showing two MOS devices. Identical elements of FIG. 2 and FIG. 1 are designated with the same reference numerals, and explanations of identical or similar parts are not repeated in principle. Since the LDMOS device 2 is parallel-type, the left-side and right-side structures of the drain are constructed (but not limited) as a mirror image.

Similar to the LDMOS device 1 of FIG. 1, the LDMOS device 2 of FIG. 2 includes two MOS devices constructed in parallel. When the left-side MOS device 31 is operated, the heavy first doping region 21 and the second doping region 22 respectively formed in the second well 14 and the first well 13 on the left side would function as the drain and the source of the left-side MOS device 31. When the right-side MOS device 32 is operated, the heavy first doping region 21 and the second doping region 22' respectively formed in the second well 14 and the first well 13' on the right side would function as the drain and the source of the right-side MOS device 32. Whether the left-side MOS device 31 or the right-side MOS device 32 is operated, the first doping region 21 as the drain is positioned below the isolation 17, which allows shorter current path from the drain to the source of the MOS device 31/32, and the on-resistance (Ron) of the device is decreased.

Moreover, only one patterned block of the isolation as the drain side of the parallel-LDMOS device is required. When the contact hole for filling the conductive plug 18 is formed to penetrate the isolation and reach the bottom 172 of the isolation, the patterned block of the isolation 17 is separated as two blocks of the isolations 17 for two MOS devices 31 and 32. Accordingly, the manufacturing method of the disclosure requires no step of patterned the isolation to form two independent isolations before forming the contact, as required in the conventional method. Thus, the manufacturing method of the disclosure is simple and time-saving. Additionally, since only one patterned block of the isolation around the drain side of the parallel-LDMOS device is fabricated, the size of the isolation 17 could be reduced, and the distance between the drain to source is consequently shorter, which also facilitate to the on-resistance of the device.

Figure 3A:
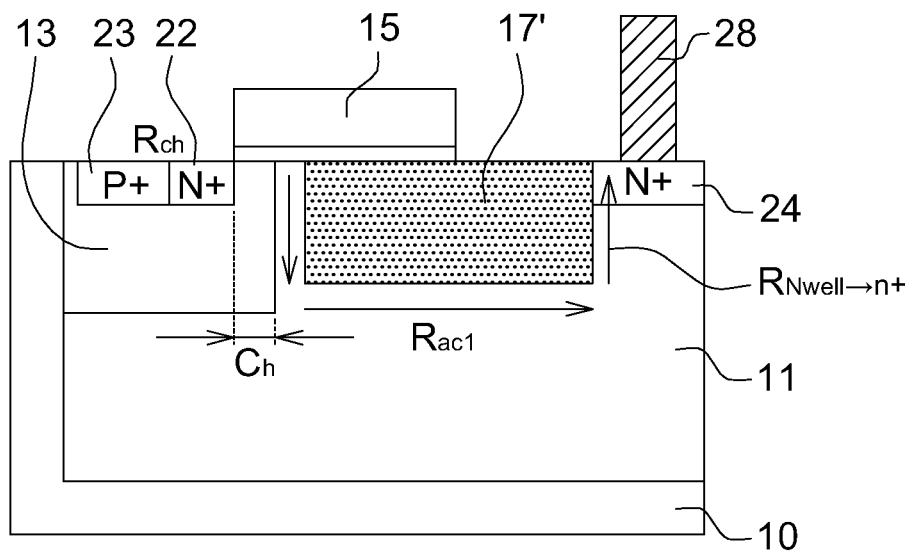
FIG. 3A and FIG. 3B respectively illustrate the current paths of a conventional LDMOS device and a LDMOS device of the disclosure during operation.
Figure 3B:
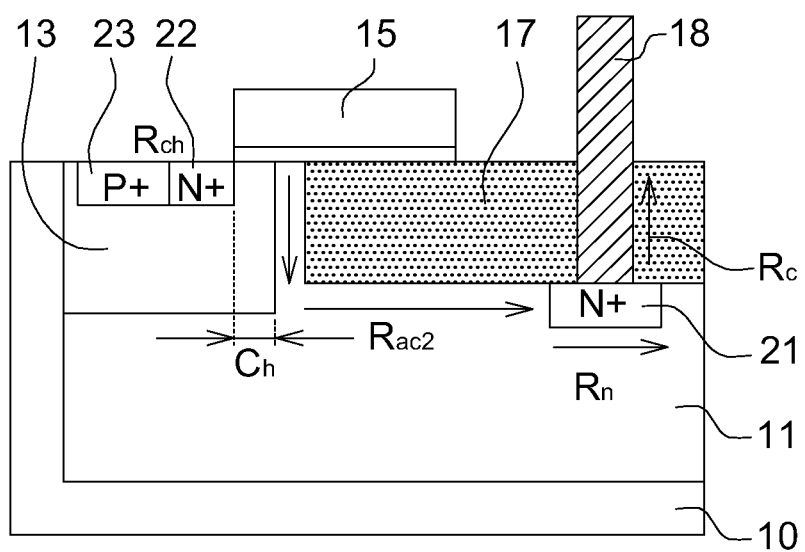

FIG. 3A and FIG. 3B respectively illustrate the current paths of a conventional LDMOS device and a LDMOS device of the disclosure during operation. Same or similar elements of FIG. 3A, FIG. 3B and FIG. 1 are designated with the same or similar reference numerals. According to the conventional LDMOS device of FIG. 3A, the first doping electrode region 24 as the drain is formed adjacent to the sidewall of the isolation 17', and the conductive plug 28 positioned on the substrate 10 connects the isolation 17', wherein the top surfaces of isolation 17' and the first doping electrode region 24 are co-planar.

A total resistance (Rtotal) from source to drain of the LDMOS device of FIG. 3A could be simply represented as equation (1):

$$Rtotal(FIG. 3A) = Rch + Rac1 + Rwell + Rn, \quad (1)$$

while a total resistance (Rtotal) from source to drain of the LDMOS device of FIG. 3B could be simply represented as equation (2):

$$Rtotal(FIG. 3B) = Rch + Rac2 + Rn + Rc, \quad (2)$$

Wherein Rch is the resistance of the channel (overlapped portion between the gate electrode 15 and the first well 13); Rac1 and Rac2 are the resistances of the isolations 17' and 17;

Rwell is the resistance of the second well 14; Rn is the resistance of the first doping electrode region 21 or 24; and Rc is the resistance of the conductive plug 18.

Compared equations (1) and (2), Rch for both devices are identical, Rac1 and Rac2 could be identical (if the size/width of the isolations 17 and 17' are the same) or Rac2<Rac1 (if the size/width of the isolation 17 is smaller than that of the isolation 17'). Also, Rwell is much larger than Rn, and Rc of the conductive plug 18 is pretty small. Therefore, the Rtotal (FIG. 3B) is much smaller than the Rtotal (FIG. 3A). Some experimental data are provided below for reference: the resistance of the N well (at 20 μm of width) is about 415 Ohm/sq (e.g. RNwell=415×20=8300 Ohm-μm); the resistance (Rn) of the first doping electrode region 21 containing n+ poly is about 135 Ohm/sq (and only 8 Ohm/sq if n+ poly with silicide); N+ contact resistance (at 0.24×0.24 μm$^2$) is about 5 to 15 Ohm/cont; and via resistance (at 0.28×0.28 μm$^2$) is 6.5 Ohm/cont.

Accordingly, the LDMOS device of the disclosure has significantly decreased the on-resistance of the LDMOS device, thereby improving the electrical characteristics of the devices. According to the simulation data, the on-resistance of the LDMOS of the disclosure has decreased more than 10%.

Accordingly, the semiconductor structure of the embodiments significantly decreases the on-resistance, and also has effect on the decrease of the ratio of Ron/BVD. For PMIC (power management integrated circuit) application, especially for the portable IC devices, the characteristic and performance of the products applied with the structure of the embodiment have been greatly improved. Moreover, the structure with conductive plug according to the embodiment could be implemented by adopting the original process, without extra step and changing most of elements' sizes in the device. The manufacturing method thereof is compatible with current process. Therefore, the structure of the embodiment is feasible for mass production. Also, the devices applied with the structure of the embodiment possess high competitiveness in the commercial market.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a substrate having a first conductive type;
   a deep well having a second conductive type, formed in the substrate and extending down from a surface of the substrate;
   a first well having the first conductive type, extending down from the surface of the substrate and formed in the deep well;
   a second well having the second conductive type, extending down from the surface of the substrate and formed in the deep well, and the second well spaced apart from the first well;
   a gate electrode, formed on a gate oxide on the substrate and disposed between the first and second wells;
   an isolation, connected to the gate oxide and extending down from the surface of the substrate and disposed between the gate electrode and the second well;
   a conductive plug penetrating into the isolation and reaching a bottom surface of the isolation, wherein the isolation is thicker than the gate oxide;
   a first doping electrode region having the second conductive type, formed below the isolation and within the second well to connect the conductive plug;
   a second doping electrode region having the second conductive type, extending down from the surface of the substrate and formed within the first well, wherein the gate electrode is disposed between the isolation and the second doping electrode region; and
   another conductive plug correspondingly and electrically connected to the second doping electrode region, wherein a bottom surface of said another conductive plug entirely and only contacts the second doping electrode region with the second conductive type.

2. The semiconductor structure according to claim 1, wherein the first doping electrode region contacts a bottom surface of the conductive plug as a drain region.

3. The semiconductor structure according to claim 1, further comprising a silicide formed at a bottom surface of the conductive plug, wherein the silicide is formed between the conductive plug and the first doping electrode region.

4. The semiconductor structure according to claim 1, wherein a bottom surface of the conductive plug is aligned with the bottom surface of the isolation.

5. The semiconductor structure according to claim 1, wherein the gate electrode partially overlies the isolation.

6. The semiconductor structure according to claim 1, further comprising a field region formed within the deep well and enclosing the second well, and the field region having the second conductive type, wherein doping concentrations of the second well, the field region and the deep well are in an order from heavy to light.

7. The semiconductor structure according to claim 1, further comprising a bulk region formed within the first well and adjacent to the second doping electrode region, the bulk region having the first conductive type and extending down from the surface of the substrate.

8. The semiconductor structure according to claim 1, wherein the isolation is a single layer or a combination of multi-layers.

9. The semiconductor structure according to claim 8, wherein the isolation comprises multi-layers selected from $SiO_2$, SiON, $Si_3N_4$, and materials with high dielectric constant.

10. The semiconductor structure according to claim 9, wherein said materials with high dielectric constant are selected from rare-earth (RE) oxides and lanthanide series metal oxides.

11. A method of manufacturing a semiconductor structure, comprising:
    providing a substrate having a first conductive type;
    forming a deep well having a second conductive type in the substrate and extending down from a surface of the substrate;
    forming a first well having the first conductive type in the deep well and extending down from the surface of the substrate;
    forming a second well having the second conductive type in the deep well and extending down from the surface of the substrate, and the second well being spaced apart from the first well;
    forming an isolation connected to a gate oxide on the substrate and extending down from the surface of the substrate and part of the isolation disposed in the second well, wherein the isolation is thicker than the gate oxide;
    forming a gate electrode on the gate oxide and disposed between the first and second wells;

forming a contact hole penetrating into the isolation and reaching a bottom surface of the isolation;

forming a first doping electrode region within the second well and below the contact hole, the first doping electrode region having the second conductive type;

forming a conductive plug in the contact hole to reach the bottom surface of the isolation, wherein the conductive plug connects the first doping electrode region;

forming a second doping electrode region having the second conductive type, extending down from the surface of the substrate and formed within the first well, wherein the gate electrode is disposed between the isolation and the second doping electrode region; and forming another conductive plug correspondingly and electrically connected to the second doping electrode region, wherein a bottom surface of said another conductive plug entirely and only contacts the second doping electrode region with the second conductive type.

12. The method according to claim 11, wherein the first doping electrode region contacts a bottom surface of the conductive plug as a drain region.

13. The method according to claim 11, further comprising: forming a silicide at a bottom surface of the conductive plug, wherein the silicide is formed between the conductive plug and the first doping electrode region.

14. The method according to claim 11, wherein a bottom surface of the conductive plug is aligned with the bottom surface of the isolation.

15. The method according to claim 11, wherein the gate electrode partially overlies the isolation.

16. The method according to claim 11, further comprising forming a field region within the deep well and enclosing the second well, and the field region having the second conductive type, wherein doping concentrations of the second well, the field region and the deep well are in an order from heavy to light.

17. The semiconductor structure according to claim 1, wherein the first doping electrode region is entirely positioned outside the isolation.

18. The semiconductor structure according to claim 1, wherein the isolation is divided into two portions by the conductive plug, and each portion of the isolation is thicker than the gate oxide.

* * * * *